United States Patent [19]
Hara

[11] Patent Number: 4,829,593
[45] Date of Patent: May 9, 1989

[54] AUTOMATIC GAIN CONTROL APPARATUS

[75] Inventor: Toshihiro Hara, Tokyo, Japan

[73] Assignee: NEC Corporation, Tokyo, Japan

[21] Appl. No.: 27,457

[22] Filed: Mar. 18, 1987

[30] Foreign Application Priority Data

Mar. 18, 1986 [JP] Japan .................................. 61-58303

[51] Int. Cl.$^4$ ........................................... H04L 27/08
[52] U.S. Cl. ................................... 455/234; 455/246; 375/98
[58] Field of Search ............... 455/234, 235, 161, 250, 455/260, 265, 240–247; 375/98, 12; 329/50

[56] References Cited

U.S. PATENT DOCUMENTS

| | | | |
|---|---|---|---|
| 3,646,448 | 2/1972 | Harmon, Jr. et al. ................. | 375/98 |
| 4,222,118 | 9/1980 | Dickinson et al. .................... | 455/247 |
| 4,385,400 | 5/1983 | Malchow ............................ | 455/234 |
| 4,479,253 | 10/1984 | Daniel, Jr. .......................... | 375/98 |
| 4,499,586 | 2/1985 | Cafaiella et al. ..................... | 375/98 |
| 4,546,326 | 10/1985 | Van Uffelen et al. ............... | 455/234 |
| 4,606,075 | 8/1986 | Eastmond ........................... | 455/234 |
| 4,625,240 | 11/1986 | Yablonski ........................... | 455/234 |
| 4,691,337 | 9/1987 | Yoshihara et al. ................... | 455/245 |
| 4,691,377 | 9/1987 | Yoshihara et al. ................... | 375/98 |

*Primary Examiner*—Robert L. Griffin
*Assistant Examiner*—Curtis Kuntz
*Attorney, Agent, or Firm*—Sughrue, Mion, Zinn, Macpeak & Seas

[57] ABSTRACT

An automatic gain control apparatus of the digital control type achieves fine control over the output amplitude of the gain controlled signal without increasing the number of bits handled by the A/D and D/A converters. The system operates by adding the output of a digital AGC converter to a variable step voltage which is set in response to the detected D.C. level of the signal to be gain-controlled.

9 Claims, 4 Drawing Sheets

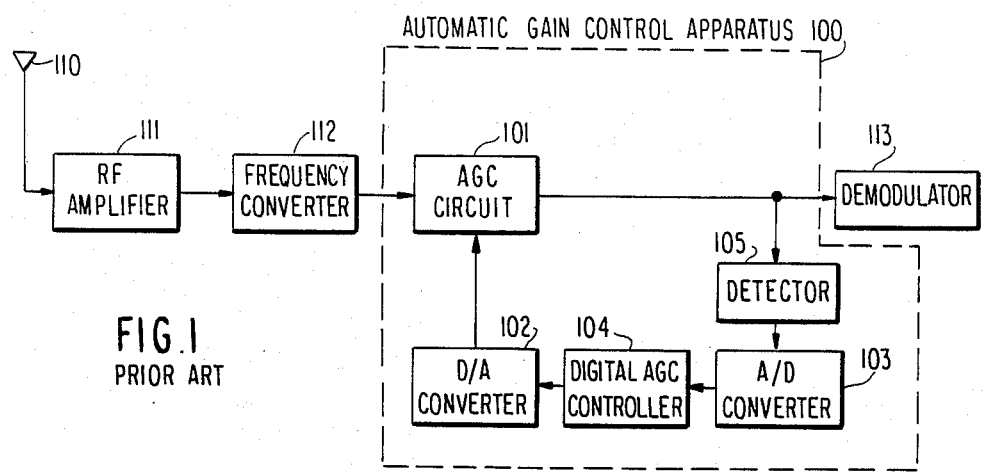
FIG.1 PRIOR ART
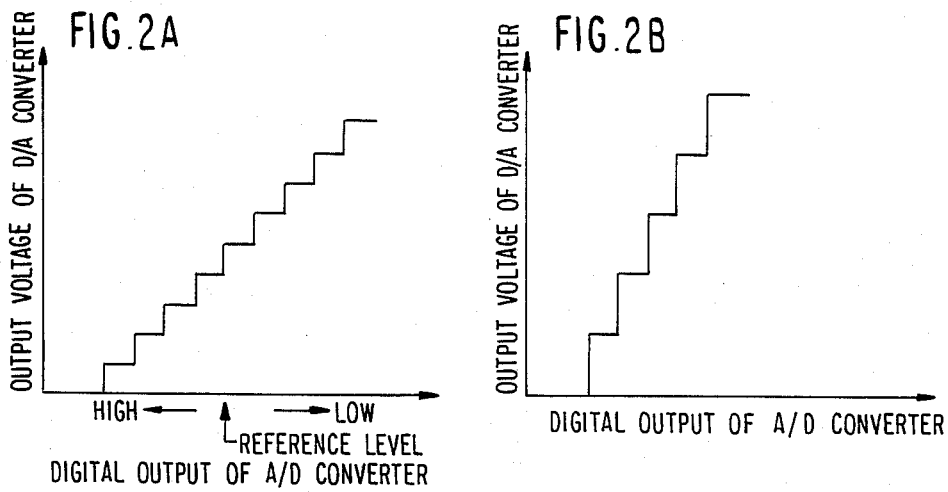
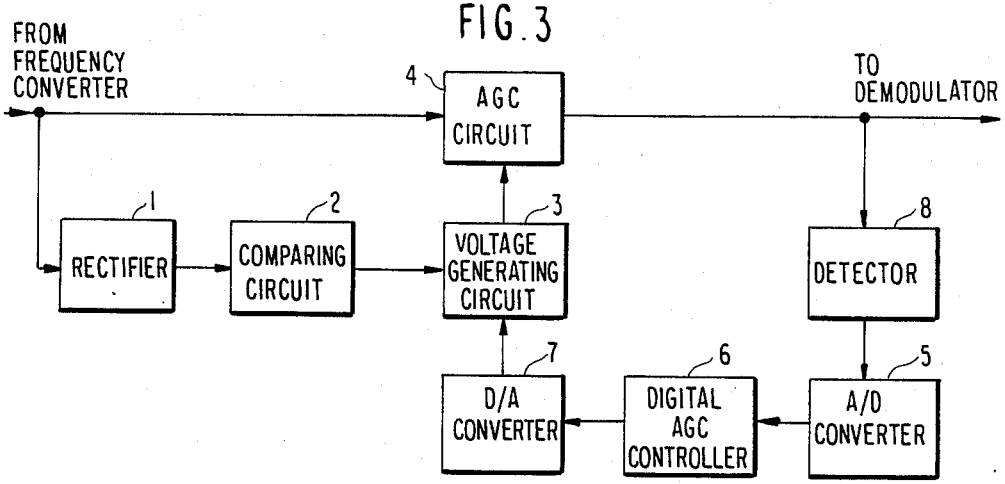

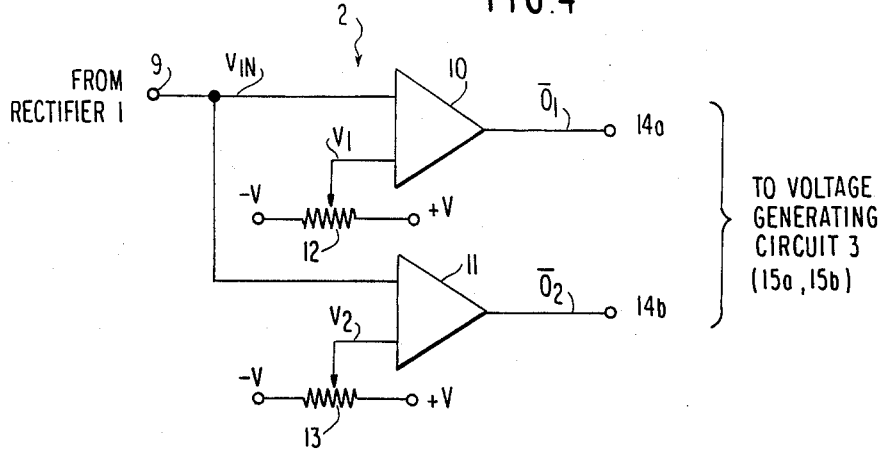
FIG.4
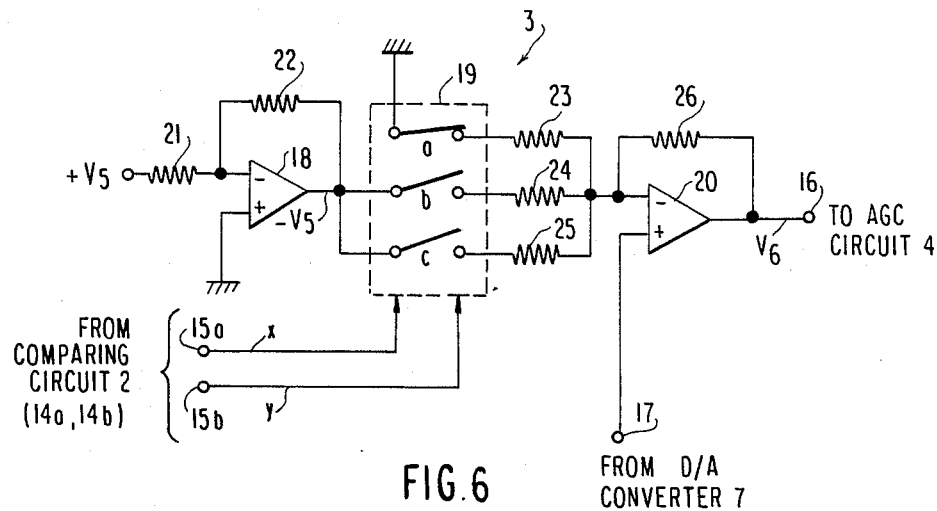
FIG.5
FIG.6

AUTOMATIC GAIN CONTROL APPARATUS

BACKGROUND OF THE INVENTION

The present invention relates to an automatic gain control apparatus for use in a receiver of a radio communication system or the like, and more particularly to an automatic gain control apparatus using a digital control technique.

Automatic gain control apparatuses are extensively used in the receivers of radio communication systems or the like, and are intended to control the gain of the received signals, which may undergo amplitude variation by fading or other causes on the radio transmission line, so as to maintain a constant amplitude. Many recent control apparatuses use a digital, instead of analog, control technique. An automatic gain control apparatus using the digital control technique is mainly composed of an automatic gain controlled (AGC) circuit (or AGC amplifier), an analog/digital (A/D) converter, a digital AGC controller and a digtal/analog (D/A) converter. In this apparatus, the output of the AGC circuit is converted by the A/D converter into a digital signal, then by the digital AGC controller into a digital control signal, and further by the D/A converter into an analog control signal, which is supplied to the AGC circuit. The AGC circuit varies its gain in response to the analog control signal, and achieves control to maintain the output of the AGC circuit at a constant amplitude.

In such an automatic gain control apparatus, as will be described in detail hereinafter, if the numbers of bits in the A/D converter and the D/A converter are small and the output amplitude variability of the AGC circuit is great, the output amplitude control by the AGC circuit will be rough, and the output of the AGC circuit will fail to be constant, resulting in amplitude modulated signals. On the other hand, if the output amplitude is to be finely controlled, the aforementioned converters will have to be able to handle greater numbers of bits, which would mean higher costs for the converters and a more complex composition of the digital AGC controller. Moreover, this would also entail finer increments and decrements in the control for the digital control signals in the digital AGC controller, resulting in the disadvantage that the controller would be unable to follow abrupt variations in input amplitude caused by fading or some other factor.

SUMMARY OF THE INVENTION

An object of the present invention is to provide a superior automatic gain control apparatus which overcomes the above mentioned disadvantages.

An automatic gain control apparatus according to the invention comprises rectifier means for converting the level of the received signal into a D.C. voltage; comparing means for converting the D.C. voltage into a first control signal; voltage generating means responsive to the first control signal and a second control signal for generating an automatic gain control voltage; AGC circuit means responsive to the automatic gain control voltage for controlling the amplitude of said received signal; detector means for envelope-detecting the output of the AGC circuit means; analog/digital converter means for converting the output of the detector means into a digital signal; digital AGC controller means digitally processing the output of the analog/digital converter means; and digital/analog converter means for converting the output of said AGC controller means into an analog signal and supplying said second control signal.

BRIEF DESCRIPTION OF DRAWINGS

FIG. 1 is a block diagram illustrating a radio receiver using an automatic gain control apparatus of the prior art;

FIGS. 2A and 2B are charts explaining the operation of the receiver shown in FIG. 1;

FIG. 3 is a block diagram of an automatic gain control apparatus which is a preferred embodiment of the present invention;

FIG. 4 is a circuit diagram illustrating an embodiment of the comparing circuit shown in FIG. 3;

FIG. 5 is a table showing the state of the output corresponding to a given voltage in the circuit of FIG. 2;

FIG. 6 is a circuit diagram illustrating an embodiment of the voltage generating circuit shown in FIG. 3;

DETAILED DESCRIPTION OF THE INVENTION

Figure 7:
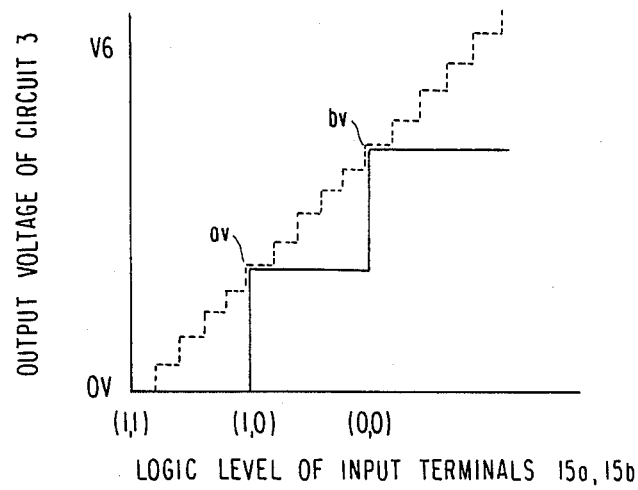
FIG. 7 is a chart explaining the operation of the circuit of FIG. 6.

Referring to FIG. 1 illustrating a radio receiver using an automatic gain control apparatus of the prior art, an RF signal, for instance an FM signal, is picked up by an antenna 110, amplified by an RF amplifier 111, then converted into an IF signal by a frequency converter 112, level-controlled by an automatic gain control apparatus 100, and demodulated by a demodulator 113.

In the automatic gain control apparatus 100, a signal which has undergone fading on the radio transmission path is supplied to an AGC circuit 101. The AGC circuit 101 is so structured as to achieve current-conversion of a voltage supplied from a D/A converter 102 and so as to be controlled by a variable gain element under current control. The output of the AGC circuit 101 is an AM (envelope) signal, which is detected by a detector 105, and entered into an A/D converter 103. Reference numeral 104 represents a digital AGC controller which uses the output of this A/D converter 103 as its input, and supplies its output to the D/A converter 102.

The operation of the automatic gain control apparatus structured in this manner will be described below with reference to FIGS. 2A and 2B.

In FIG. 2A, the digital output of the A/C converter 103 is represented on the x axis (abscissa), and the output voltage V of the D/A converter 102, on the y axis (ordinate).

The AGC controller 104 effects control so that the output of the AGC circuit 101 remains constant in amplitude. This digital AGC controller 104 has a reference level as shown in FIG. 2A. If the output signal level of the AGC circuit 102, entered from the output end of the A/D converter 103, is below the reference level, the digital AGC controller 104, as shown in FIG. 2A, will control the incrementation of a counter in the digital AGC controller 104 so as to raise the output voltage of the D/A converter 102. If it is above the reference level, the digital AGC controller 104 will control the decrementation of the counter so as to lower the output voltage of the D/A converter 102, so that the output level of the AGC circuit 101 be kept constant.

Where it is desired to finely control the output signal, the number of bits handled by the D/A converter 102 is increased.

In the above described automatic gain control apparatus using conventional digital control, a D/A converter is used for voltage control, so that the output voltage of the D/A converter varies stepwise, as shown in FIG. 2A.

If the number of bits inputted to the D/A converter 102 is relatively small and the variable range of its output voltage is widened, the output voltage will greatly vary per bit of variation (FIG. 2B), so that the control by the AGC circuit 101 will become rough, resulting in a non-constant output of the AGC circuit 101, somewhat like an amplitude-modulated signal. Consequently, if the number of bits handled by the D/A converter is increased to finely adjust the amplitude, the digital AGC controller will become unable to follow rapid fading or any abrupt variation at its counter is too slowly incremented or decremented.

FIG. 3 is a block diagram illustrating an automatic gain control apparatus according to a preferred embodiment of the present invention.

In the figure, a rectifier 1 converts the level of the received signal into a D.C. voltage. A comparing circuit or A/D converter 2 converts the output of the rectifier 1 into digital control signals. A voltage generating circuit 3 generates an AGC voltage according to the output signal of the comparing circuit 2 and the output voltage of a D/A converter 7. An AGC circuit 4 converts the output voltage of the voltage generating circuit 3 into a current and controls the amplitude of the received signal. An A/D converter 5 converts the output signal of the AGC circuit 4 into a digital signal P. A digital AGC controller 6 compares the output signal P with its own reference level Q. The controller 6 outputs a signal R which will reduce the output voltage of D/A converter 7 if P is higher than the latter or to raise it if the former is lower. A conventional digital signal comparator can be used as the controller 6. The D/A converter 7 is structured so to convert the output signal R of the digital AGC circuit 6 into an analog voltage, which is supplied to the voltage generating circuit 3. Detector 8 is for AM-detecting the output of the AGC circuit 101. These circuits 4, 5, 6, 7 and 8 respectively correspond to the circuits 101, 103, 104, 102 and 105 of the apparatus illustrated in FIG. 1.

Next will be described the operation of the preferred embodiment illustrated in FIG. 3.

First, an IF signal, whose amplitude is varied by fading on the radio transmission path, is supplied to the rectifier 1 and the AGC circuit 4. The rectifier 1 converts the level of the signal received over the radio transmission path into a D.C. voltage level signal, and its output is supplied to the comparing circuit 2. The comparing circuit 2 is intended to determine the reception level of the received signal after conversion of the same into the D.C. voltage signal by the rectifier 1, and supplies the voltage generating circuit 3 with a signal corresponding to the reception level.

Then, the voltage generating circuit 3, intended to generate a voltage to control the variable gain element of the AGC circuit 4, generates an AGC voltage according to a signal from the comparing circuit 2 and another from the D/A converter 7. The AGC circuit 4 which controls the variable gain element by varying the current thereto, receives an IF signal input with a variable amplitude level, and controls its amplitude. The A/D converter 5 converts the output signal of the AGC circuit 4, AM-detected by the detector 8, into a digital signal.

The AGC controller 6 determines whether the the value of the digital signal P inputted from the A/D converter 5 is larger or smaller than the reference level Q by digital signal processing. If larger, the controller 6 will provide an output R which will reduce the value of signal P obtained via circuits 7, 3, 4, 8 and 5 (The value of P is of course also responsive to the output of comparator 2). If P is smaller than Q, the signal R from the controller 6 will act to raise the value of P in the same manner. The D/A converter 7 converts the output digital signal R of the AGC controller 6 into an analog voltage signal.

Now will be described the specific construction of the main constituent elements of the above mentioned automatic gain control apparatus and how they operate.

First, the rectifier 1 can be composed of an ordinary full-wave rectifier circuit and a smoothing circuit, and may be an full-wave rectifier circuit having a log characteristic if it is to rectify received field signals. It converts variations in received signal amplitude into D.C. voltage signals.

Next, the comparing circuit 2 is structured as shown in FIG. 4. In FIG. 4, reference numeral 9 represents a terminal to which a D.C. voltage signal from the rectifier 1 is to be inputted, and the D.C. voltage $V_{IN}$ fed to this terminal is supplied to one of the input terminals of each of comparators 10 and 11 to undergo level determination.

In the comparators 10 and 11 are set reference levels, voltages $V_1$ and $V_2$, obtained by resistors 12 and 13 connected to $+V$ and $-V$ voltage terminals. As shown in FIG. 5, the comparator circuit 2 operates so as to make outputs $O_1$ and $O_2$ of the comparators 10 and 11 both "1" in logical level when the input D.C. voltage $V_{IN}$ is greater than voltages $V_1$ and $V_2$. The outputs $O_1$ and $O_2$ "1" and "0", respectively, when the input D.C. voltage $V_{IN}$ is below voltage $V_1$ and above $V_2$; and the outputs $O_1$ and $O_2$ are both "0" when the input D.C. voltage $V_{IN}$ is below voltages $V_1$ and $V_2$. The circuit 2 thus indicates in two-bit binary signals how the input signal level varies. In FIG. 4, reference numerals 14a and 14b represent output terminals.

Incidentally, though the embodiment shown in FIG. 4 uses two comparators, 10 and 11, a larger number of comparators can be used to achieve a finer determination of levels if signal variations are to be assessed in greater detail.

The voltage generating circuit 3 is structured as shown in FIG. 6. In FIG. 6, reference numerals 15a and 15b represent input terminals to which the outputs from the output terminals 14a and 14b of the comparing circuit 2, shown in FIG. 4, are supplied; 16 represents an output terminal, and 17, a terminal to which the voltage from the D/A converter 7 is inputted. An operational amplifier 18 inverts and amplifies a reference voltage $+V_5$ to provide a negative reference voltage $-V_5$.

The voltage $-V_5$ is inputted to a switch 19, which is opened and closed by signals x and y from the input terminals 15a and 15b. When the signals x and y are both "1" in logic level, the switch 19 closes a switch a to connect the ground level and a resistor 23. The resistor 23 here has a high resistance, as high as that of resistor 26. If the input voltage from the terminal 17 is 0 V, the output voltage $V_6$ obtained at the output terminal 16 of the operational amplifier 20 will be 0 V as shown in FIG. 7.

Then, if the logic levels of the signals x and y are "1" and "0", respectively, the switch 19 will close a switch b to connect the voltage $-V_5$ at the output end of the operational amplifier 18 to a resistor 24. The resistor 24 here has a resistance lower than the resistor 23, and voltage $-V_5$ is amplified by as much as the gain between resistors 26 and 24 to $aV$, as shown in FIG. 7, by the operational amplifier (inverting amplifier) 20.

Next, if the logic levels of the signals x and y are both "0", the switch 19 will close a switch c to connect voltage $-V_5$ at the output end of the operational amplifier 18 to a resistor 25. The resistor 25 has a lower resistance than the resistor 24, and voltage $-V_5$ is amplified by as much as the gain between resistors 26 and 25 to $bV$, as shown in FIG. 7, by the operational amplifier 20.

As is evident from FIG. 7, the output voltage of the voltage generating circuit 3 illustrated in FIG. 6 is varied stepwise, as shown in FIG. 7, by the outputs from the output terminals 14a and 14b of the comparing circuit 2 illustrated in FIG. 4.

Meanwhile, since the voltage from the D/A converter 7 supplied through the terminal 17 is entered into the non-inverted input of the operational amplifier 18, it is added to the aforementioned voltage which varies stepwise to give the voltage shown in dotted line in FIG. 7.

As a result, the range of voltage variation of the D/A converter 7 need not be greater than a single step of the solid line in FIG. 7.

Figure 8:
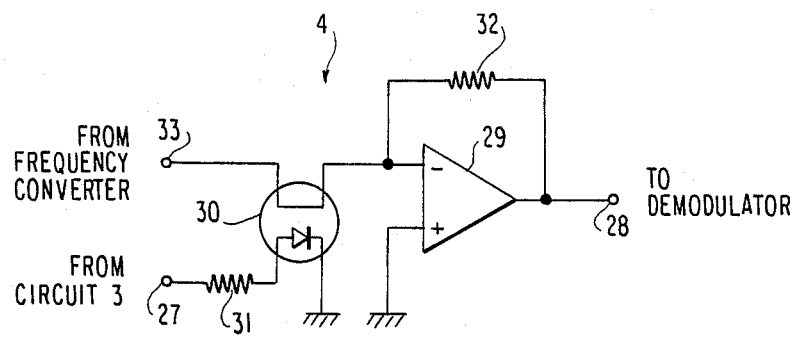
FIG. 8 is a circuit diagram illustrating an embodiment of the AGC circuit in FIG. 3.

In FIG. 8, showing an embodiment of the AGC circuit 4, the same numerals as in FIG. 1 represent respectively corresponding elements. Reference numeral 27 represents an input terminal to which a control voltage is supplied from the circuit 3 (FIG. 3); 28, an output terminal from which an output is supplied to the detector 8 and the demodulator 113 (FIG. 1); and 33, an input terminal to which an IF signal is supplied from the frequency converter 112 (FIG. 1). The AGC circuit 4 comprises an operational amplifier 29, a current-controlled variable gain element 30, and resistors 31 and 32.

The control voltage supplied to the input terminal 27 is converted into a current by the resistor 31 to control the variable gain element 30. The variable gain element 30 here has a characteristic such that its resistance is low when its current is high and vice versa. The current-controlled variable gain element 30 controls the IF signal amplitude supplied to the terminal 33.

The A/D converter 5 and D/A converter 7 may consist of an ordinary A/D converter and D/A converter, respectively. The A/D converter 5 converts the output signal of the AGC circuit 4 into a digital signal, while the D/A converter 7 converts the digital signal from the digital AGC controller 6 into an analog voltage.

The digital AGC controller 6, which may consist of an ordinary digital signal processor, will achieve control so as to reduce the output voltage of D/A converter 7 if the amplitude of the digital signal from the A/D converter 5 is above the reference level or so as to raise the output voltage of the D/A converter 7 if it is below the reference level.

As hitherto described, the present invention has tremendous benefits in practical application because it effects automatic gain control according to information on the level variation of the input signals, so that fine control can be accomplished without having to increase the number of bits in the D/A converter, a wide enough dynamic range can be secured and abrupt variations in input signal level can be effectively coped with.

What is claimed is:

1. An automatic gain control apparatus, comprising; rectifier means for receiving an input signal and converting the level of said input signal into a first D.C. voltage; comparing means for converting said first D.C. voltage into a first control signal; voltage generating means responsive to said first control signal and a second control signal for generating an automatic gain control voltage; AGC circuit means receiving said input signal and being responsive to said automatic gain control voltage for controlling the gain of said input signal; detector means for envelope-detecting the output of said AGC circuit means; analog/digital converter means for converting the output of said detector means into a digital signal; digital AGC controller means for digitally processing the output signal of said analog/digital converter means; and digital/analog converter means for converting the output signal of said AGC controller means into an analog signal constituting said second control signal.

2. An automatic gain control apparatus as claimed in claim 1, wherein said voltage generating means comprises means for converting a reference D.C. voltage into one of a plurality of D.C. voltages, in response to said first control signal, and combining means for combining the voltage of said second control signal with said, one of the plurality of D.C. voltages, thereby providing said automatic gain control voltage.

3. An automatic gain control apparatus as claimed in claim 2, wherein said rectifier means comprises a full-wave rectifier.

4. An automatic gain control apparatus as claimed in claim 1, wherein said comparing means includes a plurality of comparator means, each receiving said first D.C. voltage as one input, each said comparator means including setting means for setting a reference voltage for said comparator means, wherein each of said reference voltages for each of said plurality of comparator means is set at a different level.

5. An automatic gain control apparatus as claimed in claim 4, wherein said first control signal comprises a multi-bit signal having a number of bits equal to the number of said comparator means.

6. An automatic gain control apparatus as claimed in claim 2, wherein said comparing means includes a plurality of comparator means, each receiving said first D.C. voltage as one input, each said comparator means including setting means for setting a reference voltage for said comparator means, wherein each of said reference voltages for each of said plurality of comparator means is set at a different level.

7. An automatic gain control apparatus as claimed in claim 6, wherein said first control signal comprises a multi-bit signal having a number of bits equal to the number of said comparator means.

8. An automatic gain control apparatus as claimed in claim 6, wherein said voltage generating means comprises switching means operated in response to said multi-bit signal, and having a plurality of output terminals, resistors coupled to each of said output terminals, said resistors being commonly connected at output ends thereof to form a common output coupled to said combining means.

9. An automatic gain control apparatus as claimed in claim 8, wherein said combining means comprises an operational amplifier having a non-inverting input for receiving said second control signal.

* * * * *

UNITED STATES PATENT AND TRADEMARK OFFICE
CERTIFICATE OF CORRECTION

PATENT NO. : 4,829,593
DATED : MAY 9, 1989
INVENTOR(S) : HARA

It is certified that error appears in the above-identified patent and that said Letters Patent is hereby corrected as shown below:

Column 4, line 37, delete "$O_1$ and $O_2$" and insert --$\bar{O}_1$ and $\bar{O}_2$--.

Column 4, lines 39 and 40 delete "$O_1$ and $O_2$" and insert --$\bar{O}_1$ and $\bar{O}_2$--.

Column 4, line 42, delete "$O_1$ and $O_2$" and insert --$\bar{O}_1$ and $\bar{O}_2$--.

Signed and Sealed this

Thirtieth Day of January, 1990

*Attest:*

JEFFREY M. SAMUELS

*Attesting Officer*     *Acting Commissioner of Patents and Trademarks*